United States Patent [19]

Uy

[11] 3,974,309
[45] Aug. 10, 1976

[54] METHOD OF COATING A ROTARY INTERNAL COMBUSTION ENGINE

[75] Inventor: James C. Uy, Dearborn Heights, Mich.

[73] Assignee: Ford Motor Company, Dearborn, Mich.

[22] Filed: Dec. 16, 1974

[21] Appl. No.: 533,368

Related U.S. Application Data

[62] Division of Ser. No. 428,530, Dec. 26, 1973, Pat. No. 3,888,606.

[52] U.S. Cl. .............................. 427/250; 123/8.01; 418/179; 427/248
[51] Int. Cl.² ........................................ C23C 13/02
[58] Field of Search ............... 427/248, 250, 62; 418/179; 123/8.01

[56] References Cited
UNITED STATES PATENTS

| | | | |
|---|---|---|---|
| 3,100,723 | 8/1963 | Weed | 427/62 X |
| 3,359,956 | 12/1967 | Bentele | 418/179 X |
| 3,549,416 | 12/1970 | Rump et al. | 427/62 X |
| 3,576,670 | 4/1971 | Hammond | 427/62 X |
| 3,608,535 | 9/1971 | Winston et al. | 418/179 X |
| 3,674,544 | 7/1972 | Grosseau | 427/34 |

Primary Examiner—Harry J. Gwinnell
Attorney, Agent, or Firm—Joseph W. Malleck; Keith L. Zerschling

[57] ABSTRACT

A rotary internal combustion engine and particularly an improved rotor construction for such engine and method of making is disclosed. A coating system is applied at least to the flank surfaces of the rotor which face the variable volume combustion chambers of the engine, the system serving to reduce heat flow to the oil lubrication system within the rotor and to quench heat build-up on the above surfaces to prevent preignition. The engine is permitted to run at a somewhat higher operating temperature resulting in increased efficiency, better fuel consumption and reduction of emissions. In the method of construction, vaporizing means is employed to supply vaporizable material from two crucibles. The means can be controlled to deposit one or a mixture of said vaporizable materials. One crucible contains an adherent conductive metal and the other crucible contains an insulating medium. The vaporizing means is controlled to deposit a first layer consisting of the adherent conductive metal, a second layer consisting of a mixture of the insulating medium and adherent conductive metal, a third layer consisting essentially of an insulating medium, a fourth layer consisting essentially of a mixture of the adherent metal and insulating medium, and a fifth layer consisting of solely the adherent conductive metal.

3 Claims, 5 Drawing Figures

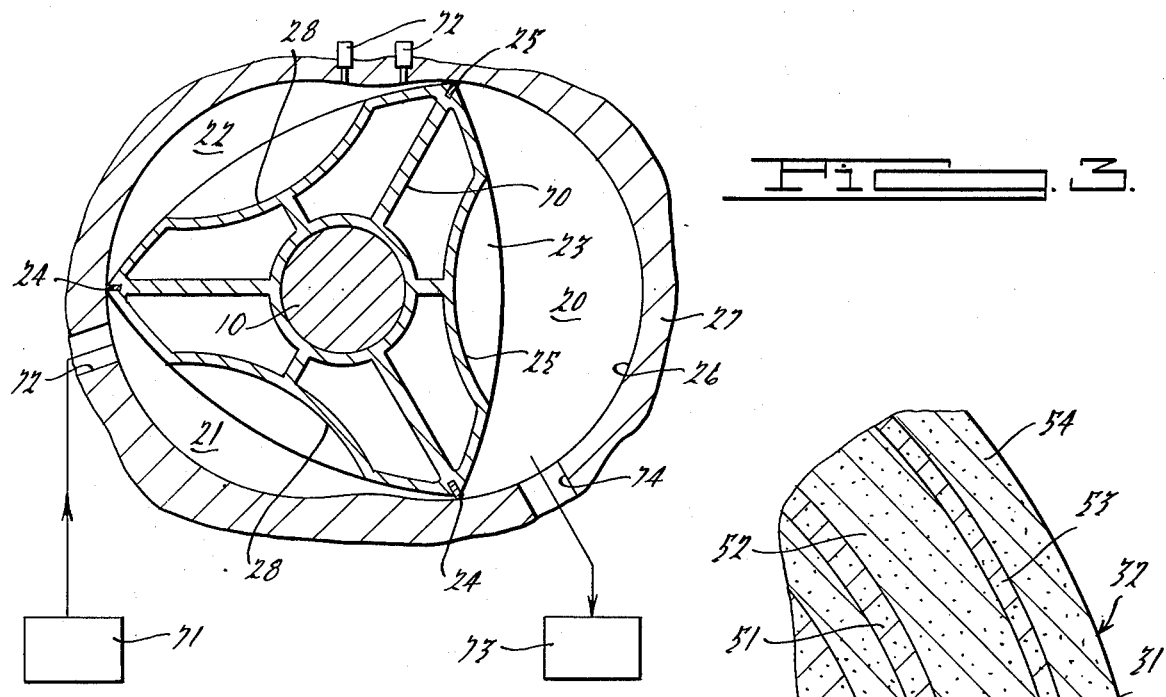
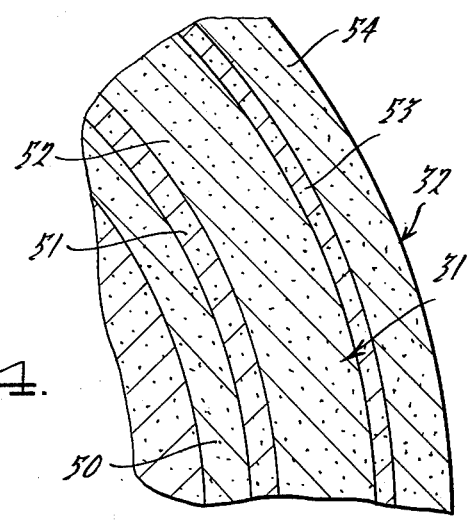
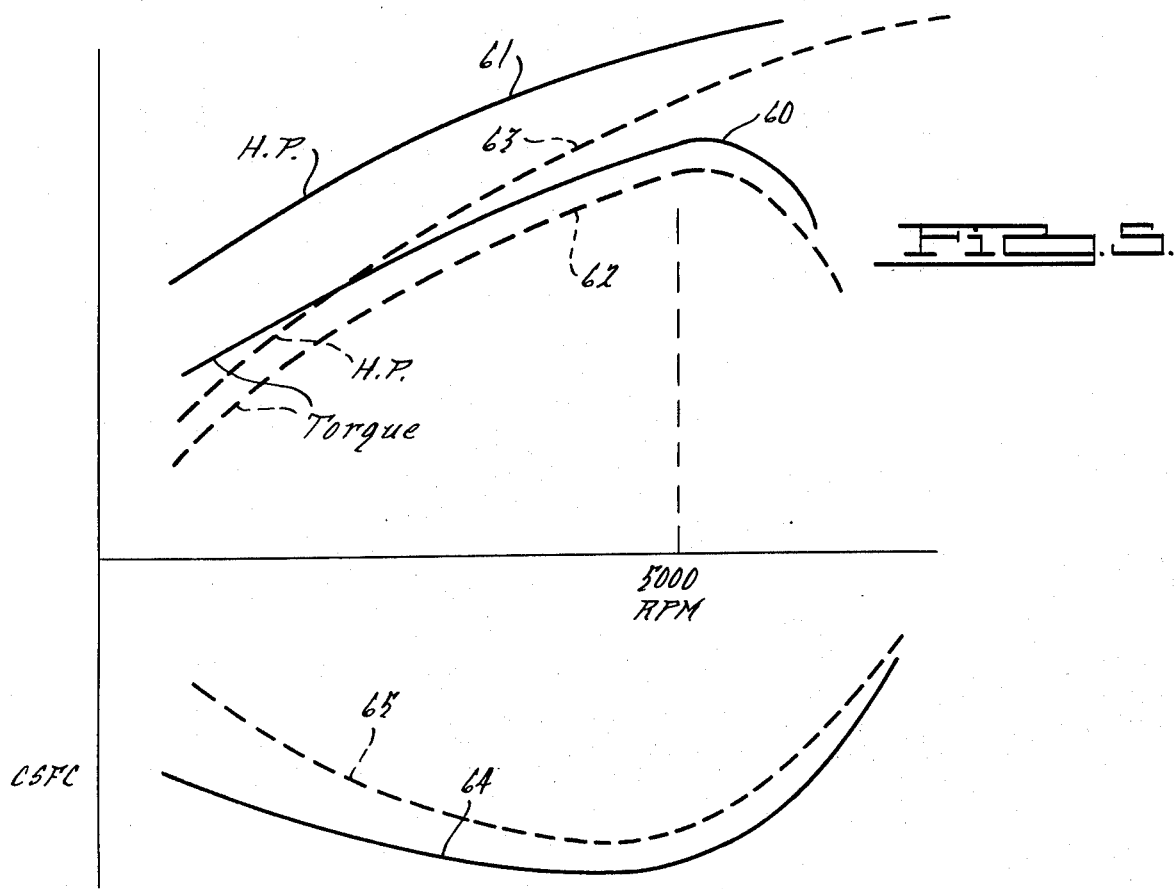

METHOD OF COATING A ROTARY INTERNAL COMBUSTION ENGINE

This is a divisional application of U.S. application Ser. No. 428,530, filed Dec. 26, 1973, now issued as U.S. Pat. No. 3,888,606.

BACKGROUND OF THE INVENTION

The unique design of a Wankel rotary engine creates some special problems with respect to heat dissipation. Conventionally, excessive heat absorbed by the materials from the rotary engine is extracted by both a water cooling system as well as the oil lubrication system, each having their own cooler or heat exchanger. The use of oil as a mechanism for extracting heat is considerably different from the use of oil in a piston engine.

To lubricate the Wankel rotary engine, one part of the oil is injected in the air-fuel mixture to lubricate the wall of the epitrochoid surface and the seals and another part of the oil is circulated onto the shaft bearings and shot into the rotor to cool same. The most important quality which the oil should possess is the ability to contribute to the heat balance of the engine. Typically the oil used in a piston engine will carry only 12% of the heat loss that is extracted by the water cooling system. In contradistinction the oil lubricating system of a Wankel engine will carry away at least 50% of the heat removed from the engine by the water cooling system and will dissipate 7% of the total energy used by the engine. Important oil temperature variations are thus observed in service within a rotary engine. At full power, the oil in the sump can easily reach temperatures of about 150°C., not withstanding external ventilation. The oil inside the rotor certainly must reach even higher temperatures.

Another problem associated with the oil lubrication system of a Wankel type engine is that of the influence of lubricating oil on the possibility of pre-ignition. The heat of the combustion process is conventionally conducted from the walls of the rotary piston so that the exposed surface of the rotor may act as a chill element to the combustible gases in the variable volume chamber. As a result, a thin layer of such gases against the rotor remains uncombusted to contribute to lower efficiency, fuel consumption and poor emissions. If the rotor were allowed to build up heat on the exposed surface, local hot spots would result in pre-ignition or "popping" of the air-fuel mixture prior to suitable ignition timing. This can be very detrimental to the serviceability of the engine. Since the variable combustion chambers of a rotary engine pass over all points of the rotor housing, only a single source of ignition is required for each rotor. Any misfiring causing by hot spots or deposits may disturb the cycle harmony and thus is one of the traditional handicaps of a rotary engine.

A related problem to unnecessary heat extraction, is the emissivity level of a typical Wankel engine. The hotter the temperature of the exhaust gases, the more effective will be control of the carbon monoxide and hydrocarbons. However, due to the excessive heat loss through the oil lubricating system, the temperature of combustion is lowered and the emissions not lowered.

SUMMARY OF THE INVENTION

The primary object of this invention is to provide an apparatus and particularly a coating system for the rotor of a rotary internal combustion engine, the apparatus being effective to substantially reduce heat loss through the oil lubricating system and thereby improve the fuel consumption and efficiency of the engine.

Another object of the invention is to provide a rotary internal combustion engine having means for lowering emission level, such means being primarily in the nature of a coating system of the rotor of such an engine.

Still another object of this invention is to provide an apparatus for a rotary internal combustion engine which is effective to decrease incidents of pre-ignition and insure that the combustion cycle is harmonized as predetermined.

Yet still another object of this invention is to provide a rotor for a rotary internal combustion engine which is simpler in interior design, and eliminates the requirement for an independent oil cooler.

A final object is to provide a method of constructing a rotor which employs ultra thin layers of discrete as well as graduated material mixture to obtain improved operating results.

SUMMARY OF THE DRAWINGS

FIG. 3 is a schematic illustration of an improved rotary engine embodying the features of this invention;

FIG. 4 is an enlarged schematic illustration of the macrostructure of one part of the coating system, as identified at A in FIG. 1; and FIG. 5 is a graphical illustration of the variation of horsepower, torque and fuel consumption with r.p.m. for a rotary engine employing the invention herein.

DETAILED DESCRIPTION

Figure 1:
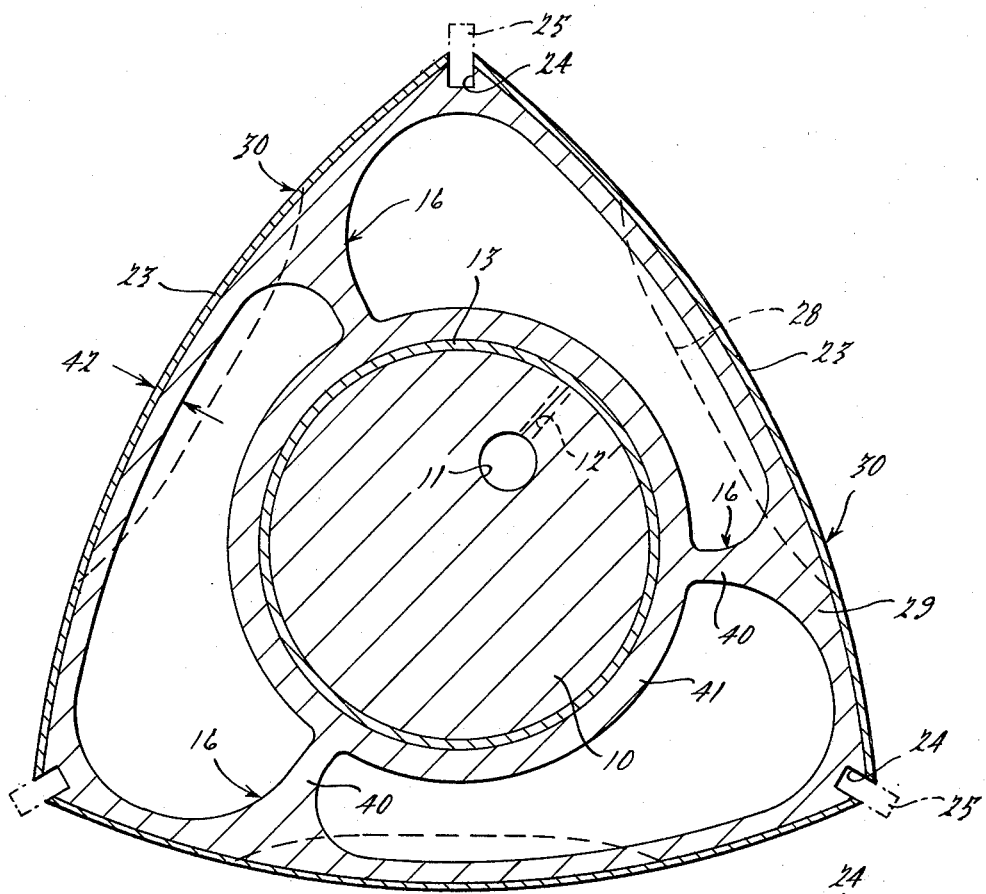
FIG. 1 is a sectional view of a rotor for a typical rotary internal combustion engine coated according to this invention and illustrating internal oil flow, the section being taken along line 1—1 of FIG. 2 to illustrate the internal chambers thereof.
Figure 2:
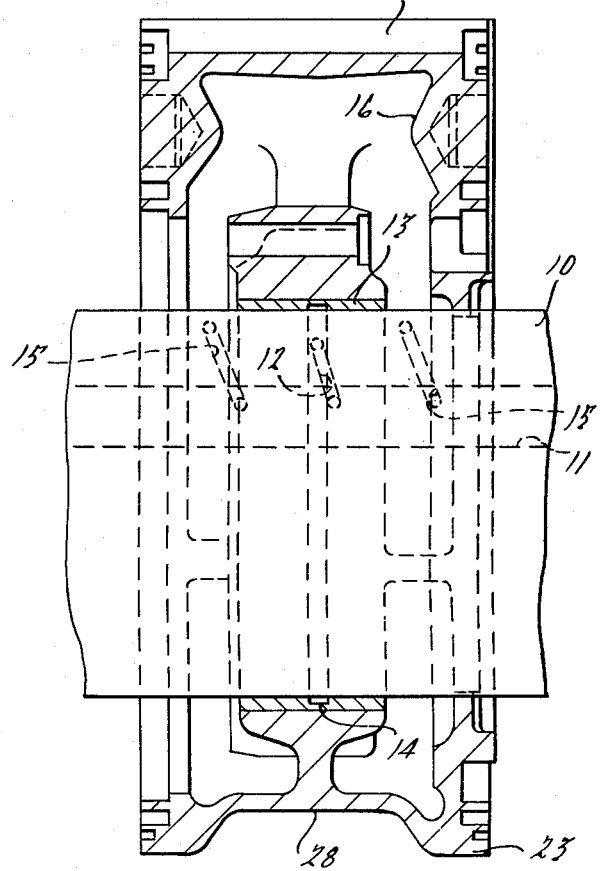
FIG. 2 is a central view taken transversely through a rotor embodying the features of this invention.

The rotary internal combustion engine is unique in that the oil lubricating system is not only extremely important to the lubrication of the main rotor bearing, but the high pressure oil is permitted to circulate through a maze of internal pockets throughout the interior of the rotor and thereby serving to conduct heat from the rotor to maintain an appropriate operating temperature for the materials of the rotor. As shown in FIGS. 1 and 2, the power shaft 10 has an internal longitudinal passage 11 with a radiating port 12 to introduce oil to the interior of the bearing sleeve 13 journalling the rotor. The sleeve 13 has an annular groove 14 to receive the oil from port 12 to distribute throughout the interior of the sleeve. Oil is shot into the various interior chambers 16 of the rotor by at least one other radial port 15 which is aimed to by-pass the bearing 13 (see FIG. 2).

The design of the materials for the rotor body is primarily selected with emphasis toward wear-resistance and durability to the combustion process. Accordingly, nodular cast iron has been preferred as a material selection, although the prior art has experimented with aluminum alloys and powder iron with graphite. Little attention has been devoted to the insulating value of the rotor material or any coating placed thereon. As a consequence, the rotor has become quite effective in transferring heat to the oil lubrication system immediately in contact with the interior of the rotor flanks. As mentioned, the heat lost through the oil lubricating system of prior art engines has been determined as at least 50% of the heat loss through the water cooling system. This constitutes at least 7% of the total energy supplied to the engine. This is a serious loss that eventually takes its toll in lower efficiency for the engine.

With conventional rotary internal combustion engines, the rotor material acts as a relative chill element to hot gases immediately adjacent thereto causing a thin film of cool gases to remain uncombusted thereby contributing not only to lower efficiency, but also to higher emissions.

Rotors typically have three flanks 23 triangularly interconnected; slots 24 are disposed at the apices for receiving seals 25 which will be in dynamic contact with an epitrochoid surface 26 of a surrounding housing 27. Combustion pockets 28 or cavities are defined in each of the rotor flanks to provide for adequate compression as each chamber (20, 21 or 22) undergoes the various cycle of the engine. Some attempt has been made to increase the efficiency and power capability of the rotary internal combustion engine by redefining the variable volume chambers 20, 21 and 22 (see FIG. 3). The redefinition of the combustion pockets 28 has been undertaken, but only limited benefits can be obtained through this facility.

This invention takes a radically new approach to improving several critical aspects of the rotary engine, namely, the efficiency, fuel consumption, emission levels and prevention of pre-ignition. To these ends, the invention requires at least two critical elements in a coating system 30 applied preferably to the rotor flanks or other outer faces, including the surfaces of the combustion pockets 28 defined in each flank; in some embodiments the coating system can be applied to. As shown in FIG. 4, the first element is an insulating medium 31 which can withstand the high temperatures of the internal engine combustion process and be sufficiently strong to operate over a long period of engine use under dynamic conditions. The insulating medium must be capable of being applied in relatively thin layers for economy and production efficiency, and must have a high insulating value.

The second element comprises a heat quenching medium 32 which is applied about the insulating medium as an envelope to dynamically distribute heat throughout the mass of the quenching medium to prevent local hot spots that may cause pre-ignition and at the same time reduce the film of cooled gases in contact therewith. If the insulating medium was exposed to the hot gases, local hot spots would occur because of its poor heat conductivity. The exposed surface of the rotor is maintained at a higher temperature, but uniform throughout for reducing the film of non-combusted gases. As a result, the engine will have considerably hotter exhaust gases which will prove to be an advantage with respect to reducing emission levels of the engine. The housing will also operate at a higher temperature, but this has proved not to be a problem for the selected materials.

As a specific preferred embodiment, the rotor construction would comprise a nodular cast iron substrate or body 29 as shown in FIG. 1 having the triangulated flanks 23 with combustion pockets 28 disposed in the central area of each flank. The casting has a free-form type of interior including depending walls 40 connecting with a central hub 41. The hub is journalled upon an oiled bearing sleeve 13. Slots 24 are defined in the apices of the casting to receive apex seal assemblies 25 therein. The relative minimum thickness 42 of the casting between the internal chambers 16 and outer exposed flank surface is about 0.02 inch. The flank surfaces are typically machined 10 mils under the final required dimension for the rotor to accommodate the coating system to be described.

As shown in FIG. 4, the coating system consists of a first layer 50 plasma sprayed, as a flash coating, onto the flanks 23 and pockets 28. The layer 50 consists of a 1:1 mixture of nickelchromium; its thickness is in the range of 0.001–0.0015 inch thick. It is important that layer 50 be uniform and continuous. Next a layer 51 of transition material (mixture of nickel-chromium and stabilized zirconia) is plasma sprayed onto layer 50; the latter should have a thickness in the range of 0.005–0.001 inch. Some open spots in this layer are tolerable and thus the extreme thinness is serviceable. A layer 52 (part of the insulating medium 31) of stabilized zirconia is plasma sprayed thereover in a thickness range of 0.004–0.0045 inch. Greater thicknesses up to 0.01 inch can be utilized, but beyond the latter problems of rotor balancing may enter.

A fourth layer 53, acting as an intermediate transition coating, is plasma sprayed over the stabilizer zirconia; layer 53 consists of a mixture of nickel-chromium and zirconia and should have a nichrome thickness in the range of 0.0005–0.001 inch. Lastly, a layer 54 (part of heat quenching medium 32) of an equal mixture of nickel-nichrome is plasma sprayed thereon in the thickness range of 0.001–0.002 inch.

The total coating system should not exceed 0.001 inch and none of the stabilized zirconia should be allowed to be exposed.

The insulating coating should be selected from materials having a thermal conductivity less than 20 BTU/HR/Ft.$^2$/°F./in. Materials which would be excellent candidates with this in mind would comprise stabilized zirconia (having a thermal conductivity of about 7–8), thorium oxide (having a thermal conductivity of about 0.24), mica (having a thermal conductivity of about 4.8), magnesium oxide (having a thermal conductivity of about 18). The ability to insulate against heat transfer is a phenomenon that will depend upon the lattice vibration or electron energy of the crystalline structure. Accordingly, stabilized zirconia is desirable since the alpha phase has been stabilized such as by CaO to raise the alpha to beta transition temperature. Plasma spraying is very helpful since air pockets can be imported into the applied zirconia and controlled in size to increase the insulating value. The selected particles of zirconia are heated and impacted with a high force so as to form a self-fused coating and preferably should have a Rockwell C hardness of about 33 and a porosity of 6%.

The heat conducting means 32, which is preferably comprised of a nickel-chromium composite, is commercially referred to as nichrome. Equivalent materials can be selected from the group consisting of copper, aluminum iron, chromium or alloys of such metals. The fundamental purpose of such heat conducting means is to distribute heat across the surface of the rotor flanks and prevent pre-ignition of uncombusted gases therein.

As a result of the use of the above coating system, a large fraction of the heat normally lost through the oil lubricating system can now be put to use in the engine. This is sensed through an approximate increase in the power from the expansion of combustion gases. As shown in FIG. 5, there is a definite increase in both the torque and horsepower curves 60 and 61 respectively for an engine having the present invention, over the similar curves 62 and 63 for a prior art engine. Maximum benefit is realized at low r.p.m. where heat transfer can be more effective with time. Similarly, the observed specific fuel consumption will be improved, as shown in FIG. 5, as represented by curve 64 for a conventionally constructed engine and curve 65 for an engine embodying this invention. This is a direct result of a reduction of the wall quenching effect so prevelent in rotary engines. The layer of unburned gases co-existing near the walls is reduced considerably.

The above benefits which flow from the new rotor structure, above described, can result in a new freedom of engine design. Since the rotor can now be well insulated, the need for oil swirling just inside the rotor flanks can be reduced or eliminated. This permits a simpler rotor design and may eliminate the need for an oil cooler normally associated with the oil lubricating system. The thermal conductivity ratio of stabilized zirconia to cast iron is about 1 to 60 which insulates extremely well.

Since the oil lubricating system need only serve the bearing sleeve, the engine can then have the elements as shown in FIG. 3. The rotor can have the internal chambers rearranged so that webbing 70 can be placed to give maximum strength to the rotor with the greatest reduction in mass, such as reduction in thickness of the flank walls. Means 71, for introducing a combustible mixture into a chamber as it passes intake port 72, is shown. Dual spark means 72 is disposed adjacent the minor axis of the epitrochoid for igniting the mixture at a predetermined moment of compression. Out-take means 73 exhausts combusted gas through port 74.

Certain other methods of applying the various layers can be employed, such as sputtering or vapor deposition. In such instances, coating of the entire rotor, rather than just the flanks may be obtained provided ultra thin layers are used. One particularly unique method of preparing an insulated rotor is as follows:

1. Prepare a rotor for a rotary internal combustion engine by conventional casting techniques and define said rotor with triangularly related flanks, flat sidewalls, combustion pockets centralized in each of said flanks, and internal webbing effective to support said flanks and sidewalls on a hub with a maximum reduction of mass.
2. Provide a vapor deposition apparatus having at least two crucibles, one of which contains an adherent conductive metal for vaporization and the other containing an insulating medium vaporizable for providing an insulating coating, said apparatus having separate controls for communicating one or both of the vapors from said crucible to a deposition chamber.
3. Place said prepared rotor in said chamber and sequentially coat said rotor with five distinct layers. The first layer should consist of said adherent conductive metal in a deposited thickness of between 0.0005–0.0015 inch.
4. While continuing to supply vapor of said adherent conductive metal to said deposition chamber, the controls are shifted to introduce simultaneously and graduated the vapor of said insulating medium. A composite transition layer is deposited having ultimately an equal mixture of said adherent metal and said insulating medium, the layer having a deposited thickness in the range of approximately 0.0003–0.001 inch.
5. Eliminate vapor communication from said adherent metal and permit solely the vapor of said insulating medium to deposit a third layer thereon in the thickness range of approximately 0.0005–0.01 inch.
6. While continuing to supply vapor of said insulating medium, the vapor from said conductive metal crucible is introduced simultaneously and graduated to ultimately provide an equal mixture of insulating medium and conductive metal to define a fourth layer in the thickness range of 0.0005–0.0015 inch.
7. Eliminate the communication of the vapor from said insulating medium so that solely the vapor from said conductive metal is introduced for providing a final and fifth coating in the thickness range of 0.001–0.002 inch.

The insulating medium can be selected from the group consisting of zirconia, mica thorium oxide, magnesium oxide and organic materials having a high resistance to temperature. The adherent metal is selected from the group consisting of copper, aluminum, iron, chromium and mixtures or alloys thereof.

I claim:
1. A method of fabricating an insulated rotor for a rotary internal combustion engine, comprising:
    1. preparing a rotor for a rotary internal combustion engine by conventional casting techniques and defining said rotor with triangularly related flanks, flat sidewalls, combustion pockets centralized in each of said flanks, and internal webbing effective to support said flanks and sidewalls on a hub with maximum reduction of mass,
    2. providing a vapor deposition apparatus having at least two crucibles, one of which contains an adherent conductive metal for vaporization and the other containing an insulating medium vaporizable for providing an insulating coating, said apparatus having separate controls for communicating one or both of the vapors from said crucibles to a deposition chamber,
    3. placing said prepared rotor in said chamber and sequentially coating said rotor with five distinct layers, the first layer consisting of said adherent conductive metal in a deposited thickness of between 0.0005–0.0015 inch,
    4. while continuing to supply vapor of said adherent conductive metal to said deposition chamber, changing said controls to introduce simultaneously and gradually the vapor of said insulating medium to deposit a second layer consisting ultimately of an equal mixture of said adherent metal and said insulating medium, said second layer having a deposited thickness in the range of approximately 0.0003–0.001 inch,
    5. eliminating vapor communication from said adherent metal and permitting solely the vapor of said insulating medium to deposit a third layer thereon in the thickness range of approximately 0.0005–01 inch,
    6. while continuing to supply vapor of said insulating medium, simultaneously introducing the vapor from said conductive metal crucible to gradually deposit a fourth layer ultimately consisting of an equal mixture of insulating medium and conductive metal in the thickness range of 0.0005–0.0015 inch, and 7. eliminating communication of the vapor from said insulating medium so that solely the vapor from said conductive metal is introduced to said chamber for providing a final and fifth layer in the thickness range of 0.001–0.002 inch.

2. The method as in claim 1, in which the insulating medium is selected from the group consisting of zirconia, stabilized zirconia, mica, thorium oxide, and magnesium oxide.

3. The method as in claim 1, in which the adherent metal is selected from the group consisting of copper, aluminum, iron, chromium and mixtures or alloys thereof.

* * * * *